United States Patent [19]

Madan

[11] Patent Number: 4,469,715

[45] Date of Patent: Sep. 4, 1984

[54] P-TYPE SEMICONDUCTOR MATERIAL HAVING A WIDE BAND GAP

[75] Inventor: Arun Madan, Birmingham, Mich.

[73] Assignee: Energy Conversion Devices, Inc., Troy, Mich.

[21] Appl. No.: 505,824

[22] Filed: Jun. 20, 1983

Related U.S. Application Data

[62] Division of Ser. No. 234,287, Feb. 13, 1981.

[51] Int. Cl.$^3$ .............................................. B05D 5/12
[52] U.S. Cl. ...................................... 427/74; 427/85; 427/93; 427/94; 427/95
[58] Field of Search ...................... 427/74, 85, 93, 94, 427/95

Primary Examiner—Bernard D. Pianalto
Attorney, Agent, or Firm—Lawrence G. Norris

[57] ABSTRACT

The production of improved photoresponsive amorphous alloys and devices, such as photovoltaic, photoreceptive devices and the like; having improved wavelength threshold characteristics is made possible by adding one or more band gap increasing elements to the alloys and devices. The increasing element or elements are added at least to a portion of the active photoresponsive regions of amorphous silicon devices. One increasing element is carbon which increases the band gap from that of the materials without the increasing element incorporated therein. Other increasing elements can be used such as nitrogen. The silicon and increasing elements are concurrently combined and deposited as amorphous alloys by vapor deposition, sputtering or glow discharge decomposition. A density of states reducing element allows the band gap increasing element(s) to be added to the alloy to adjust the band gap without reducing the electronic qualities of the alloy. The compensating or altering element(s) can be added during deposition of the alloy or following deposition. The addition of the increasing element(s) to the alloys increases the band gap to a widened utilization width for a particular device to increase the photoabsorption efficiency and to thus enhance the device photoresponse. The band gap increasing element(s) can be added in varying amounts, in discrete layers or in substantially constant amounts in the alloys and devices.

22 Claims, 13 Drawing Figures

P-TYPE SEMICONDUCTOR MATERIAL HAVING A WIDE BAND GAP

This is a division of application Ser. No. 234,287 filed Feb. 13, 1981.

BACKGROUND AND SUMMARY OF THE INVENTION

This invention relates to a method of making amorphous alloys having an increased band gap and devices made therefrom. The invention has its most important application in making improved photoresponsive alloys and devices having large band gaps at least in a portion thereof for specific photoresponsive applications including photoreceptive devices such as solar cells of a p-i-n or p-n junction type; photoconducting medium such as utilized in xerography; photodetecting devices and photodiodes including large area photodiode arrays.

Silicon is the basis of the huge crystalline semiconductor industry and is the material which has produced expensive high efficiency (18 percent) crystalline solar cells. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials, useful in solar cells and current control devices, are produced under very carefully controlled conditions by growing individual single silicon or germanium crystals, and, when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large scale use of crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained, hence the material thickness is not reduced. The polycrystalline material also involves the addition of grain boundaries and other problem defects.

An additional shortcoming of the crystalline material, for solar applications, is that the crystalline silicon band gap of about 1.1 eV inherently is below the optimum band gap of about 1.5 eV. The admixture of germanium, while possible, further narrows the band gap which further decreases the solar conversion efficiency.

In summary, crystal silicon devices have fixed parameters which are not variable as desired, require large amounts of material, are only producible in relatively small areas and are expensive and time consuming to produce. Devices manufactured with amorphous silicon can eliminate these crystal silicon disadvantages. Amorphous silicon has an optical absorption edge having properties similar to a direct gap semiconductor and only a material thickness of one micron or less is necessary to absorb the same amount of the sunlight as the 50 micron thick crystalline silicon. Further, amorphous silicon can be made faster, easier and in larger areas than can crystal silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. LeComber of Carnegie Laboratory of Physics, University of Dundee, in Dundee, Scotland, did some work on "Substitutional Doping of Amorphous Silicon", as reported in a paper published in *Solid State Communications*, Vol. 17, pp. 1193–1196, 1975, toward the end of reducing the localized states in the energy gap in amorphous silicon or germanium to make the same approximate more closely intrinsic crystalline silicon or germanium and of substitutionally doping the amorphous materials with suitable classic dopants, as in doping crystalline materials, to make them extrinsic and of p or n conduction types.

The reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphene ($PH_3$) for n-type conduction or a gas of diborane ($B_2H_6$) for p-type conduction was premixed with the silane gas and passed through the glow discharge reaction tube under the same operating conditions. The gaseous concentration of the dopants used was between about $5 \times 10^{-6}$ and $10^{-2}$ parts per volume. The material so deposited including supposedly substitutional phosphorous or boron dopant was shown to be extrinsic and of n or p conduction type.

While it was not known by these researchers, it is now known by the work of others that the hydrogen in the silane combines at an optimum temperature with many of the dangling bonds of the silicon during the glow discharge deposition to substantially reduce the density of the localized states in the energy gap toward the end of making the amorphous material approximate more nearly the corresponding crystalline material.

In working with a similar method of glow discharge fabricated amorphous silicon solar cells utilizing silane, D. E. Carlson attempted to utilize germanium in the cells to narrow the optical gap toward the optimum solar cell value of about 1.5 eV from his best fabricated solar cell material which has a band gap of 1.65-1.70 eV. (D. E. Carlson, *Journal of Non Crystalline Solids*, Vol. 35 and 36 (1980) pp. 707-717, given at 8th International Conference on Amorphous and Liquid Semi-Conductors, Cambridge, Mass., Aug. 27-31, 1979). However, Carlson has further reported that the addition of germanium from germane gas was unsuccessful because it causes significant reductions in all of the photovoltaic parameters of the solar cells. Carlson indicated that the degradation of photovoltaic properties indicates that defects in the energy gap are being created in the deposited films. (D. E. Carlson, *Tech. Dig.* 1977 IEDM, Washington, D.C., p. 214).

In the *Tech. Dig.* article above referenced, Carlson also reported the addition of impurity gases, such as $N_2$ and $CH_4$. Carlson concludes that these gases "have little effect on the photovoltaic properties even when they constitute 10% of the discharge atmosphere," but 30% of $CH_4$ causes degradation of the photovoltaic properties. No suggestion is made by Carlson that the addition of these gases can increase the band gap of the resulting material. Carlson does state in the first referenced article that the development of a boron-doped "wide band gap, highly conductive p-type material" is desirable, but made no suggestion as to which of "several additives" should be utilized to open the band gap. Carlson further stated that "there is no evidence to date that the material can be made highly conductive and p-type."

After the development of the glow discharge deposition of silicon from silane gas was carried out, work was done on the sputter depositing of amorphous silicon films in an atmosphere of a mixture of argon (required by the sputtering deposition process) and molecular hydrogen, to determine the results of such molecular hydrogen on the characteristics of the deposited amorphous silicon film. This research indicated that the hydrogen acted as a compensating agent which bonded in such a way as to reduce the localized states in the energy gap. However, the degree to which the localized states in the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

The non optimum spectral response of prior art amorphous silicon photoresponsive devices is overcome in accordance with the present invention by adding one or more band gap increasing elements to an amorphous photoresponsive alloy at least in one or more p doped regions thereof to adjust the band gap to an increased utilization width for particular applications.

The amorphous alloy preferably incorporates at least one density of states reducing element which can be added during deposition or thereafter. The band gap increasing element(s) can be activated and may be added in vapor deposition, sputtering or glow discharge processes. The band gap can be increased as required for a specific application by introducing the necessary amount of one or more of the increasing elements into the deposited alloy in at least one p doped region thereof. The band gap is increased without substantially increasing the number of states in the band gap of the alloy and devices, because of the presence of the reducing element in the alloy.

Since the band increasing element(s) have been tailored into the material without adding substantial deleterious states, the new alloy maintains high quality electronic qualities when the adjusting element(s) are added to tailor the wavelength threshold for a specific photoresponse application.

While the principles of this invention apply to each of the aforementioned deposition processes, for purposes of illustration herein a vapor and a plasma activated vapor deposition environment are described. A glow discharge system is disclosed in U.S. Pat. No. 4,226,898 entitled, Amorphous Semiconductors Equivalent to Crystalline Semiconductors, issued Oct. 7, 1980 to Stanford R. Ovshinsky and Arun Madan, which is incorporated herein by reference, which system has other process variables which advantageously can be utilized with the principles of this invention.

DESCRIPTION OF THE PREFERRED EMBODIMENTS

Figure 1:
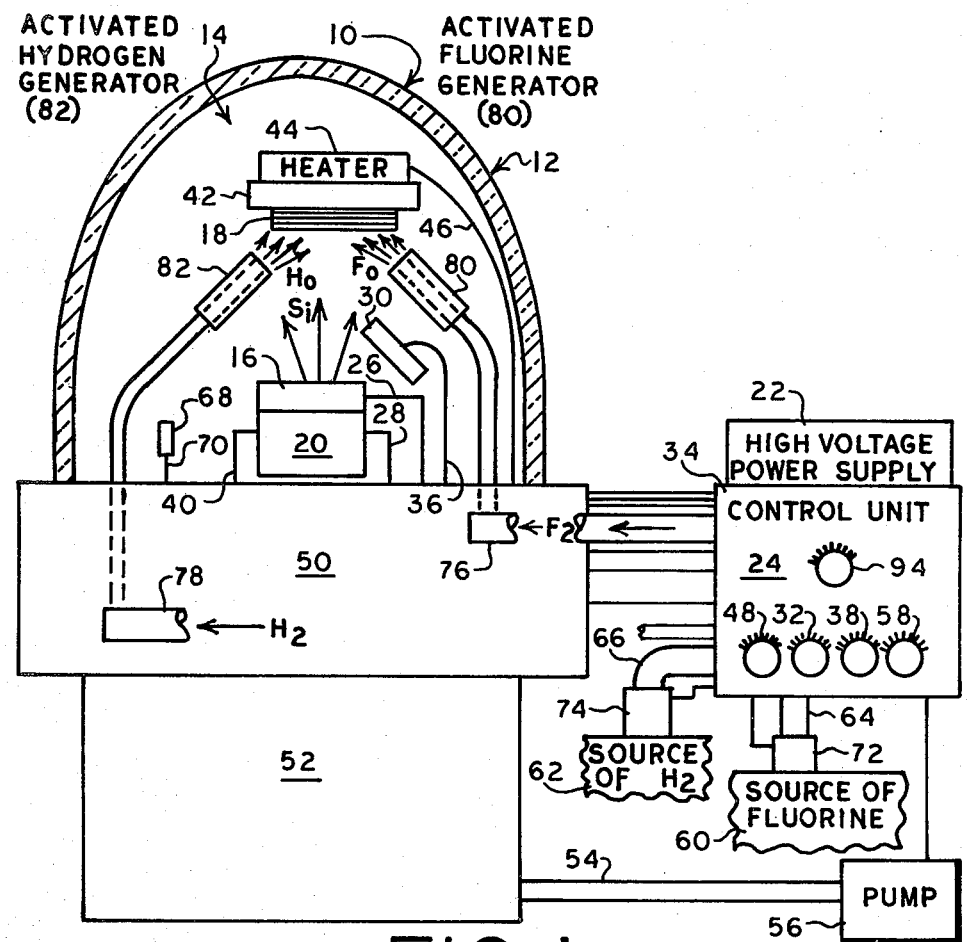
FIG. 1 is a diagrammatic representation of more or less conventional vacuum deposition equipment to which has been added elements for carrying out the addition of fluorine and hydrogen by the addition of molecular or fluorine compounds containing fluorine such as $SiF_4$, and hydrogen inlets and activated fluorine and hydrogen generating units which decompose the molecular fluorine and hydrogen within the evacuated space of the vapor deposition equipment, to convert molecular fluorine and hydrogen to activated fluorine and hydrogen and to direct one or both against the substrate during the deposition of an amorphous alloy containing silicon.

Referring now more particularly to FIG. 1, there is shown vapor deposition equipment generally indicated by reference numeral 10, which may be conventional vapor deposition equipment to which is added an activated compensating or altering material injecting means to be described. This equipment, as illustrated, includes a bell jar 12 or similar enclosure enclosing an evacuated space 14 in which is located one or more crucibles 16 containing the amorphous semiconductor film-producing element or elements to be deposited on a substrate 18. In the form of the invention being described, the crucible 16 initially contains silicon for forming an amorphous alloy containing silicon on the substrate 18 which, for example, may be a metal, crystalline or polycrystalline semiconductor or other material upon which it is desired to form the alloy to be deposited by the process of the present invention. An electron beam source 20 is provided adjacent to the crucible 16, which electron beam source, diagrammatically illustrated, usually includes a heated filament and beam deflection means (not shown) which directs a beam of electrons at the silicon contained in the crucible 16 to evaporate the same.

A high voltage DC power supply 22 provides a suitable high voltage, for example, 10,000 volts DC, the positive terminal of which is connected through a control unit 24 and a conductor 26 to the crucible 16, the negative terminal of which is connected through the control unit 24 and a conductor 28 to the filament of the electron beam source 20. The control unit 24 includes relays or the like for interrupting the connection of the power supply 22 to the conductors 26 and 28 when the film thickness of an alloy deposition sampling unit 30 in the evacuated space 14 reaches a given value set by operating a manual control 32 on a control panel 34 of the control unit 24. The alloy sampling unit 30 includes a cable 36 which extends to the control unit 24 which includes well known means for responding to both the thickness of the alloy deposited upon the alloy sampling unit 30 and the rate of deposition thereof. A manual control 38 on the control panel 34 may be provided to fix the desired rate of deposition of the alloy controlled by the amount of current fed to the filament of the electron beam source through a conductor 40 in a well known manner.

The substrate 18 is carried on a substrate holder 42 upon which a heater 44 is mounted. A cable 46 feeds energizing current to the heater 44 which controls the temperature of the substrate holder 42 and substrate 18 in accordance with a temperature setting set on a manual control 48 on the control panel 34 of the control unit 24.

The bell jar 12 is shown extending upwardly from a support base 50 from which the various cables and other connections to the components within the bell jar 12 may extend. The support base 50 is mounted on an enclosure 52 to which connects a conduit 54 connecting to a vacuum pump 56. The vacuum pump 56, which may be continuously operated, evacuates the space 14 within the bell jar 12. The desired pressure of the bell jar is set by a control knob 58 on the control panel 34. In this form of the invention, this setting controls the pressure level at which the flow of activated fluorine and/or hydrogen into the bell jar 12 is regulated. Thus, if the control knob is set to a bell jar pressure of $10^{-4}$ torr, the flow of fluorine and/or hydrogen into the bell jar 12 will be such as to maintain such pressure in the bell jar as the vacuum pump 56 continues to operate.

Sources 60 and 62 of molecular fluorine and hydrogen are shown connected through respective conduits 64 and 66 to the control unit 24. A pressure sensor 68 in the bell jar 12 is connected by a cable 70 to the control unit 24. Flow valves 72 and 74 are controlled by the control unit 24 to maintain the set pressure in the bell jar. Conduits 76 and 78 extend from the control unit 24 and pass through the support base 50 into the evacuated space 14 of the bell jar 12. Conduits 76 and 78 respectively connect with activated fluorine and hydrogen generating units 80 and 82 which convert the molecular fluorine and hydrogen respectively to activated fluorine and hydrogen, which may be atomic and/or ionized forms of these gases. The activated fluorine and hydrogen generating units 80 and 82 can be heated tungsten filaments which elevate the molecular gases to their decomposition temperatures or a plasma generating unit well known in the art for providing a plasma of decomposed gases. Also, activated fluorine and hydrogen in ionized forms formed by plasma can be accelerated and injected into the depositing alloy by applying an electric field between the substrate and the activating source. In either event, the activated fluorine and hydrogen generator units 80 and 82 are preferably placed in the immediate vicinity of the substrate 18, so that the relatively short-lived activated fluorine and hydrogen delivered thereby are immediately injected into the vicinity of the substrate 18 where the alloy is depositing. As indicated previously, either or both fluorine and hydrogen are preferably included in the alloy. The activated fluorine and/or hydrogen as well as other compensating or altering elements also can be produced from compounds containing the elements instead of from a molecular gas source.

As previously indicated, to produce useful amorphous alloys which have the desired characteristics for use in photoresponsive devices such as photoreceptors and solar cells, the compensating or altering agents, materials or elements produce a very low density of localized states in the energy gap without changing the basic intrinsic character of the film. This result is achieved with relatively small amounts of activated fluorine and hydrogen so that the pressure in the evacuated bell jar space 14 can still be a relatively low pressure (like $10^{-4}$ torr). The pressure of the gas in the generator can be higher than the pressure in the bell jar by adjusting the size of the outlet of the generator.

The temperature of the substrate 18 is adjusted to obtain the maximum reduction in the density of the localized states in the energy gap of the amorphous alloy involved. The substrate surface temperature will generally be such that it ensures high mobility of the depositing materials, and preferably also be below the crystallization temperature of the depositing alloy.

The surface of the substrate can be irradiated by radiant energy to further increase the mobility of the depositing alloy material, as by mounting an ultraviolet light source (not shown) in the bell jar space 14. Alternatively, instead of the activated fluorine and hydrogen generator units 80 and 82 in FIG. 1, these units can be replaced by an ultraviolet light source 84 shown in FIG. 2, which directs ultraviolet energy against the substrate 18. This ultraviolet light will decompose the molecular fluorine and/or hydrogen both spaced from and at the substrate 18 to form activated fluorine (and hydrogen) which diffuses into the depositing amorphous alloy condensing on the substrate 18. The ultraviolet light also enhances the surface mobility of the depositing alloy material.

Figure 2:
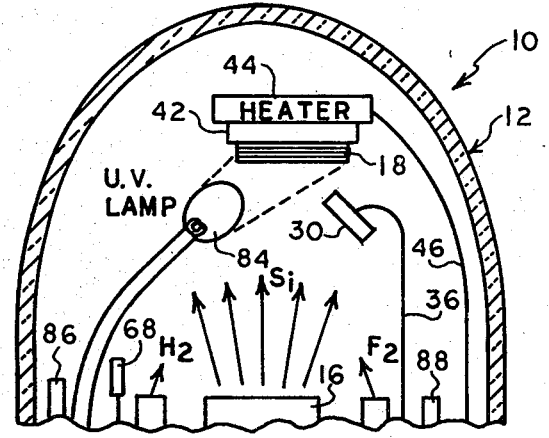
FIG. 2 illustrates vacuum deposition equipment like that shown in FIG. 1, with activated fluorine (and hydrogen) generating means comprising an ultraviolet light source irradiating the substrate during the process of depositing the amorphous alloy, such light source replacing the activated fluorine and hydrogen generator units shown in FIG. 1 and increasing element generating means.

In FIGS. 1 and 2, the band gap increasing elements can be added in gaseous form in an identical fashion to the fluorine and hydrogen by replacing the hydrogen generator 82 or by adding one or more activated increasing element generators 86 and 88 (FIG. 2). Each of the generators 86 and 88 typically will be dedicated to one of the increasing elements such as carbon or nitrogen. For example, the generator 86 could supply carbon as in the form of methane gas ($CH_4$).

Figure 3:
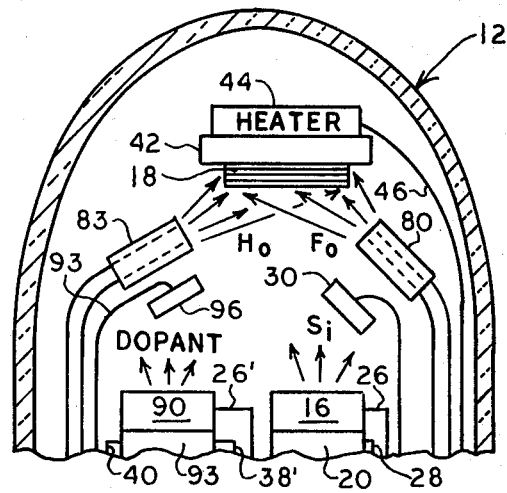
FIG. 3 illustrates the vacuum deposition equipment for FIG. 1 to which has been added additional means for doping the depositing alloy with an n or p conductivity producing material.

Referring now to FIG. 3 which illustrates additions to the equipment shown in FIG. 1 for adding other agents or elements to the depositing alloy, an n-conductivity dopant, like phosphorous or arsenic, may be initially added to make the intrinsically modest n-type alloy a more substantially n-type alloy, and then a p-dopant like aluminum, gallium or indium may be added to form a good p-n junction within the alloy. A crucible 90 is shown for receiving a dopant like arsenic which is evaporated by bombarding the same with an electron beam source 92, like the beam source 20 previously described. The rate at which the dopant evaporates into the atmosphere of the bell jar 12, which is determined by the intensity of the electron beam produced by the electron beam source 92, is set by a manual control 94 on the control panel 34, shown in FIG. 1 which controls the current fed to the filament forming part of this beam source to produce the set evaporation rate. The evaporation rate is measured by a thickness sampling unit 96 upon which the dopant material deposits and which generates a signal on a cable 98 extending between the unit 96, and control unit 24, which indicates the rate at which the dopant material is deposited on the unit 96.

After the desired thickness of amorphous alloy having the desired degree of n-conductivity has been deposited, evaporation of silicon and the n-conductivity dopant is terminated and the crucible 90 (or another crucible not shown) is provided with a p-conductivity dopant described, and the amorphous alloy and dopant deposition process then proceeds as before to increase the thickness of the amorphous alloy with a p-conductivity region therein.

The band increasing element(s) also can be added by a similar process to that described for the dopant by utilizing another crucible similar to the crucible 90.

In the case where the amorphous alloys comprise two or more elements which are solid at room temperature, then it is usually desirable to separately vaporize each element placed in a separate crucible, and control the deposition rate thereof in any suitable manner, as by setting controls on the control panel 34 which, in association with the deposition rate and thickness sampling units, controls the thickness and composition of the depositing alloy.

While activated fluorine and hydrogen are believed to be the most advantageous compensating agents for use in compensating amorphous alloys including silicon, in accordance with the broader aspects of the invention, other compensating or altering agents can be used. For example, oxygen may be useful in reducing the density of localized states in the energy gap when used in small amounts so as not to change the intrinsic characteristic of the alloy.

Figure 4:
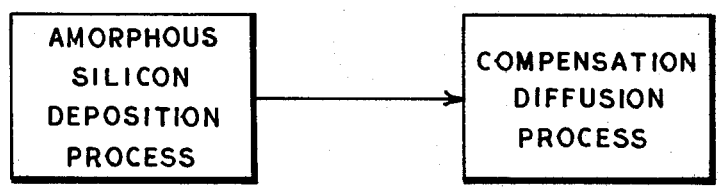
FIG. 4 illustrates an application wherein the deposition of the amorphous alloy and the application of the activated fluorine and hydrogen may be carried out as separate steps and in separate enclosures.
Figure 5:
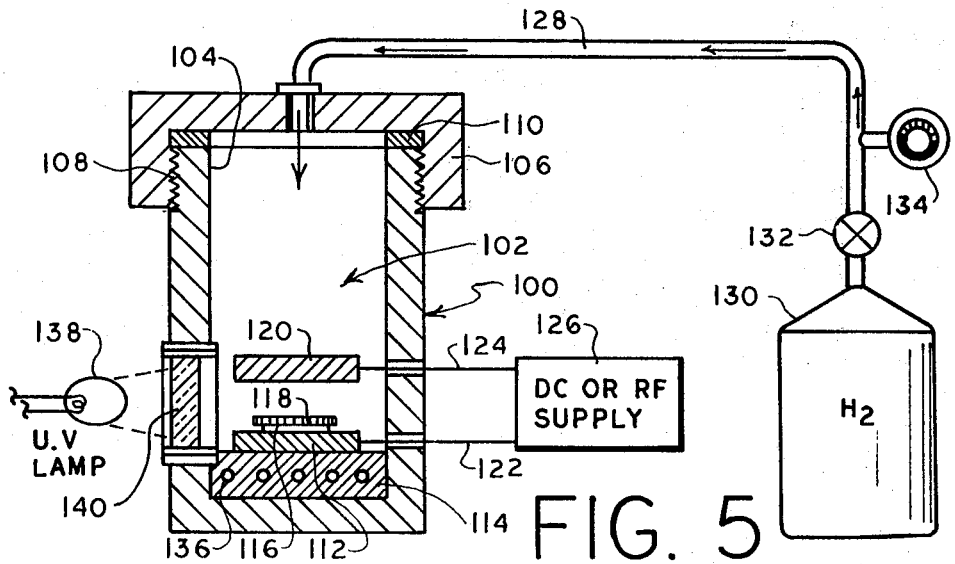
FIG. 5 illustrates exemplary apparatus for diffusing activated hydrogen into a previously deposited amorphous alloy.

As previously indicated, although it is preferred that compensating and other agents be incorporated into the amorphous alloy as it is deposited, in accordance with another aspect of the invention, the amorphous alloy deposition process and the process of injecting the compensating and other agents into the semiconductor alloy can be done in a completely separate environment from the depositing of the amorphous alloy. This can have an advantage in certain applications since the conditions for injecting such agents are then completely independent of the conditions for the alloy deposition. Also, as previously explained, if the vapor deposition process produces a porous alloy, the porosity of the alloy, in some cases, is more easily reduced by environmental conditions quite different from that present in the vapor deposition process. To this end, reference should now be made to FIGS. 4 and 5 which illustrate that the amorphous deposition process and the compensating or altering agent diffusion process are carried out as separate steps in completely different environments, FIG. 5 illustrating apparatus for carrying out the post-compensation diffusion process.

As there shown, a low pressure container body 100 is provided which has a low pressure chamber 102 having an opening 104 at the top thereof. This opening 104 is closed by a cap 106 having threads 108 which thread around a corresponding threaded portion on the exterior of the container body 100. A sealing O-ring 110 is sandwiched between the cap 106 and the upper face of the container body. A sample-holding electrode 112 is mounted on an insulating bottom wall 114 of the chamber 100. A substrate 116 upon which an amorphous semiconductor alloy 118 has already been deposited is placed on the electrode 112. The upper face of the substrate 116 contains the amorphous alloy 118 to be altered or compensated in the manner now to be described.

Spaced above the substrate 116 is an electrode 120. The electrodes 112 and 120 are connected by cables 122 and 124 to a DC or RF supply source 126 which supplies a voltage between the electrodes 112 and 120 to provide an activated plasma of the compensating or altering gas or gases, such as fluorine, hydrogen, and the like, fed into the chamber 102. For purposes of similicity, FIG. 5 illustrates only molecular hydrogen being fed into the chamber 102 by an inlet conduit 128 passing through the cap 106 and extending from a supply tank 130 of molecular hydrogen. Other compensating or altering gases (such as fluorine and the like) also may be similarly fed into the chamber 102. The conduit 128 is shown connected to a valve 132 near the tank 130. A flow rate indicating gauge 134 is shown connected to the inlet conduit 128 beyond the valve 132.

Suitable means are provided for heating the interior of the chamber 102 so that the substrate temperature is elevated preferably to a temperature below, but near the crystallization temperature of the film 118. For example, coils of heating wire 136 are shown in the bottom wall 114 of the chamber 102 to which coils connect a cable (not shown) passing through the walls of the container body 100 to a source of current for heating the same.

The high temperature together with a plasma of gas containing one or more compensating elements developed between the electrodes 112 and 120 achieve a reduction of the localized states in the band gap of the alloy. The compensating or altering of the amorphous alloy 118 may be enhanced by irradiating the amorphous alloy 118 with radiant energy from an ultraviolet light source 138, which is shown outside of the container body 100 directing ultraviolet light between the electrodes 112 and 120 through a quartz window 140 mounted in the side wall of the container body 100.

The low pressure or vacuum in the chamber 102 can be developed by a vacuum pump (not shown) such as the pump 56 in FIG. 1. The pressure of the chamber 102 can be on the order of 0.3 to 2 Torr with a substrate temperature on the order of 200° to 450° C. The activated fluorine and hydrogen, as well as other compensating or altering elements, also can be produced from compounds containing the elements instead of from a molecular gas source, as previously mentioned. Examples of compounds of use in the present invention include such increasing elements as methane ($CH_4$) and ammonia ($NH_3$).

Figure 6:
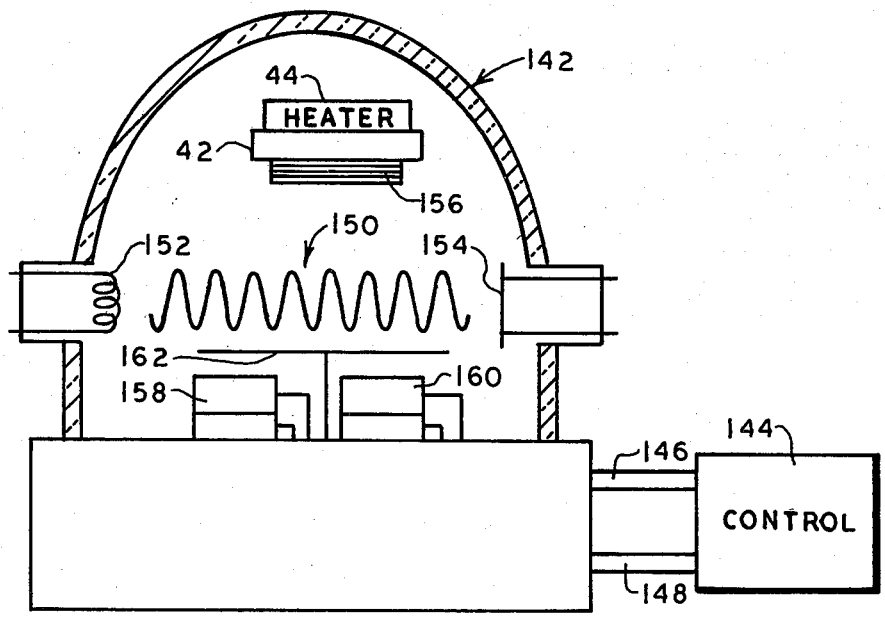
FIG. 6 is a diagrammatic representation of a plasma activated vapor deposition system for depositing the amorphous alloys with the increasing element(s) of the invention incorporated therein.

A plasma-activated vapor deposition chamber 142 is illustrated in FIG. 6 in which the semiconductor and band increasing element(s) of the invention (described infra) can be deposited. A control unit 144 is utilized to control the deposition parameters, such as pressure (generally maintained at about $10^{-3}$ Torr or less), flow rates, etc., in a manner similar to that previously described with respect to the unit 24.

One or more reaction gas conduits, such as 146 and 148, can be utilized to supply reaction gases into a plasma region 150. The plasma region 150 is established between a coil 152 fed by a DC power supply (not illustrated) and a plate 154. The plasma activates the supply gas or gases to supply activated gases to be deposited on a substrate 156. The substrate 156 may be heated to the desired deposition temperature by heater means 44 as previously described.

The band gap increasing element(s) and silicon can be added from two or more evaporation boats, such as 158 and 160. The boat 158 could for example contain carbon and the boat 160 would contain silicon. The elements in boats 158 and 160 can be evaporated by electron beam or other heating means and are activated by the plasma.

If it is desired to layer the band gap increasing element(s) in the photogenerating region of the film being deposited, a shutter 162 can be utilized. The shutter could rotate layering separate band gap increasing elements from two or more of the boats or can be utilized to control the depositing of the band gap increasing element from the boat 158 (or others) to provide layers in the film or to vary the amount of band gap increasing element deposited in the film. Thus, the band gap increasing element(s) can be added discreetly in layers, in substantially constant or in varying amounts.

Each of the device semiconductor alloy layers can be glow discharge deposited upon the base electrode substrate by a conventional glow discharge chamber described in the aforesaid U.S. Pat. No. 4,226,898. The alloy layers also can be deposited in a continuous process described in U.S. Pat. No. 4,400,409, issued Aug. 23, 1983, for A Method of Making P-Doped Silicon Films and Devices Made Therefrom, to Masatsugu Izu, Vincent D. Cannella and Stanford R. Ovshinsky. In these cases, the glow discharge system initially is evacuated to approximately 1 m-Torr to purge or eliminate impurities in the atmosphere from the deposition system. The alloy material preferably is then fed into the deposition chamber in a compound gaseous form and a glow discharge plasma is obtained therefrom. The deposition system in Ser. No. 887,353 preferably is operated at a pressure in the range of about 0.3 to 1.5 Torr, preferably between 0.6 to 1.0 Torr such as about 0.6 Torr.

The semiconductor material is deposited from a self-sustained plasma onto the substrate which is heated, preferably by infrared means, to the desired deposition temperature for each alloy layer. The doped layers of the devices are deposited at various temperatures in the range of about 200° C. to about 1000° C., depending upon the form of the material used. The upper limitation on the substrate temperature in part is due to the type of metal substrate utilized. For aluminum the upper temperature should not be above about 600° C. and for stainless steel it could be above about 1000° C. For an initially hydrogen compensated amorphous alloy to be produced, such as to form the intrinsic layer of the p-i-n device, the substrate temperature should be less than about 400° C. and preferably about 300° C.

The doping concentrations are varied to produce the desired p, p+, n or n+ type conductivity as the alloy layers are deposited for each device. For n or p doped layers, the material is doped with 5 to 100 ppm of dopant material as it is deposited. For n+ or p+ doped layers the material is doped with 100 ppm to over 1 percent of dopant material as it is deposited. The p dopant material can be conventional dopants or the method and materials described in U.S. Pat. No. 4,400,409 deposited at the respective dopant concentrations preferably in the range of 100 ppm to over 5000 ppm for the p+ material.

The glow discharge deposition process in U.S. Pat. No. 4,400,409 includes an AC signal generated plasma into which the materials are introduced. The plasma preferably is sustained between a cathode and substrate anode with an AC signal of about 1 kHz to 13.6 MHz.

Although the band gap increasing method and element(s) of the invention can be utilized in devices with various amorphous alloy layers, it is preferable that they are utilized with the fluorine and hydrogen compensated glow discharge deposited alloys. In this case, a mixture of silicon tetrafluoride and hydrogen is deposited as an amorphous compensated alloy material at or below about 400° C., for the n-type layer. The intrinsic amorphous alloy layer and the p+ layer can be deposited upon the electrode layer at a higher substrate temperature above about 450° C. which will provide a material which is fluorine compensated.

Various types of devices which may advantageously utilize the improved amorphous alloys produced in accordance with the unique processes of the invention are illustrated in FIGS. 7 through 10.

Figure 7:
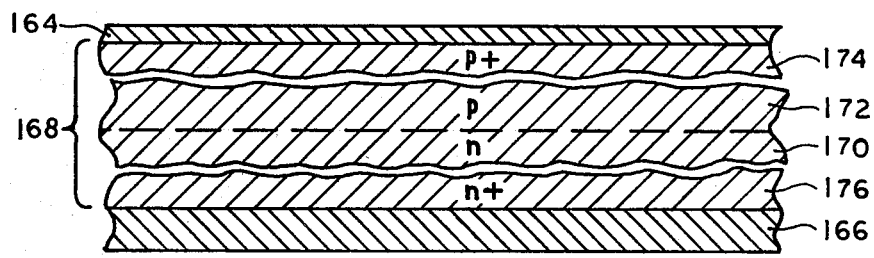
FIG. 7 is a fragmentary sectional view of a p-n junction solar cell device which includes a doped amorphous semiconductor alloy made by the process of the invention.

A solar cell construction which utilizes p-n junctions in the body of the amorphous alloy that forms a part thereof may be formed in accordance with the successive deposition, compensating or altering and doping steps as above described. Such a device is illustrated in FIG. 7 which generally includes a transparent electrode 164 through which the solar radiation energy penetrates into the body of the solar cell. Between this transparent electrode and an opposite electrode 166 is a deposited amorphous alloy 168, preferably including silicon, initially compensated in the manner previously described. In this amorphous alloy 168 are at least two adjacent regions 170 and 172 where the amorphous alloy has respectively oppositely doped regions, region 170 being shown as a n-conductivity region and region 172 being shown as a p-conductivity region. The doping of the regions 170 and 172 is only sufficient to move the Fermi levels to the valence and conduction bands involved so that the dark conductivity remains at a low value. The alloy 168 has high conductivity, highly doped ohmic contact interface regions 174 and 176 of the same conductivity type as the adjacent region of the alloy 168. The alloy regions 174 and 176 contact electrodes 164 and 166, respectively. The increasing element(s) is added to region 174 and could also be added to region 172.

Figure 8:
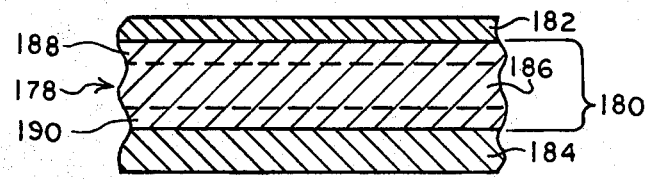
FIG. 8 is a fragmentary sectional view of a photodetection device which includes in amorphous semiconductor alloy made by the process of the invention.

Referring now to FIG. 8, there is illustrated another application of an amorphous alloy utilized in a photodetector device 178 whose resistance varies with the amount of light impinging thereon. An amorphous alloy 180 thereof is band gap increased and compensated or altered in accordance with the invention, has no p-n junctions as in the embodiment shown in FIG. 7, and is located between a transparent electrode 182 and a substrate electrode 184. In a photodetector device it is desirable to have a minimum dark conductivity and so the amorphous alloy 180 has an undoped, but compensated or altered region 186 and heavily doped regions 188 and 190 of the same conductivity type forming a low resistance ohmic contact with the electrodes 182 and 184, which may form a substrate for the alloy 180. The increasing element(s) are added at least to the region 188.

Figure 9:
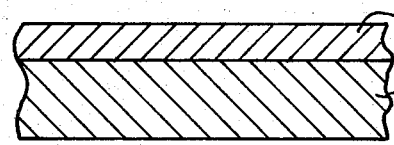
FIG. 9 is a fragmentary sectional view of a xerographic drum including an amorphous semiconductor alloy made by the process of the invention.

Referring to FIG. 9, an electrostatic image producing device 192 (like a xerography drum) is illustrated. The device 192 has a low dark conductivity, selective wavelength threshold, undoped or slightly p-doped amorphous alloy 194 deposited on a suitable substrate 196 such as a drum. The increasing element(s) are added to the alloy 194 at least near the outer region thereof.

As used herein, the terms "compensating agents or materials" and "altering agents, elements or materials" mean materials which are incorporated in the amorphous alloy for altering or changing the structure thereof, such as activated fluorine and hydrogen incorporated in the amorphous alloy containing silicon to form an amorphous silicon/fluorine/hydrogen composition alloy, having a desired band gap and a low density of localized states in the energy gap. The activated fluorine and hydrogen is bonded to the silicon in the alloy and reduces the density of localized states therein and, due to the small size of the fluorine and hydrogen atoms, are both readily introduced into the amorphous alloy without substantial dislocation of the silicon atoms and their relationships in the amorphous alloy. This is true most particularly because of the extreme electronegativity, specificity and reactivity of fluorine, all of which characteristics organize the local order of the alloys through the inductive powers of fluorine. The ability of fluorine to bond with both silicon and hydrogen results in the formation of alloys with a minimum of localized defect states in the energy gap. Hence, fluorine and hydrogen are introduced without substantial formation of other localized states in the energy gap.

Figure 10:
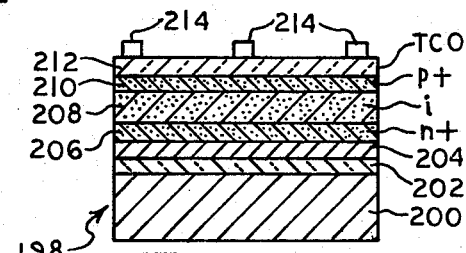
FIG. 10 is a fragmentary sectional view of a p-i-n junction solar cell device which includes an amorphous semiconductor alloy made by the process of the invention.

An application (device) utilizing improved amorphous alloys produced by the unique processes of the invention is shown in FIG. 10. Referring now to FIG. 10, a p-i-n solar cell 198 is illustrated having a substrate 200 which may be glass or a flexible web formed from stainless steel or aluminum. The substrate 200 is of a width and length as desired and preferably at least 3 mils thick. The substrate has an insulating layer 202 deposited thereon by a conventional process such as chemical deposition, vapor deposition or anodizing in the case of an aluminum substrate. The layer 202 for instance, about 5 microns thick can be made of a metal oxide. For an aluminum substrate, it preferably is aluminum oxide ($Al_2O_3$) and for a stainless steel substrate it may be silicon dioxide ($SiO_2$) or other suitable glass.

An electrode 204 is deposited in one or more layers upon the layer 202 to form a base electrode for the cell 198. The electrode 204 layer or layers is deposited by vapor deposition, which is a relatively fast deposition process. The electrode layers preferably are reflective metal electrodes of molybdenum, aluminum, chrome or stainless steel for a solar cell or a photovoltaic device. The reflective electrode is preferable since, in a solar cell, non-absorbed light which passes through the semiconductor alloy is reflected from the electrode layers 204 where it again passes through the semiconductor alloy which then absorbs more of the light energy to increase the device efficiency.

The substrate 200 is then placed in the deposition environment wherein the n+, intrinsic and p+ layers may be successively formed in accordance with the present invention. These layers form the active layers of the device.

While the device illustrated in FIG. 10 may have other utilities, it will now be described as a photovoltaic device. Utilized as such, the selected outer, p+ layer 210 is preferably a low light absorption, high conductivity alloy layer having the increasing element(s) therein. The intrinsic alloy layer 208 is designed for a solar photo-response, high light absorption, low dark conductivity and high photoconductivity. The bottom alloy layer 206 is a low light absorption, high conductivity n+ layer. The overall device thickness between the inner surface of the electrode layer 204 and the top surface of the p+ layer 210 is on the order of at least about 3,000 angstroms. The thickness of the n+ doped layer 206 is preferably in the range of about 50 to 500 angstroms while the thickness of the intrinsic alloy 208 is between about 3,000 angstroms and 30,000 angstroms. The top p+ contact layer 210 also is preferably between about 50 and 500 angstroms in thickness. Due to the shorter diffusion length of the holes and the desire to avoid absorption of light therein, the p+ layer should generally be kept as thin as possible.

Following the deposition of the various semiconductor alloy layers in the desired order, a further deposition step is performed, preferably in a separate deposition environment. Desirably, a vapor deposition environment is utilized since it is a fast deposition process. In this step, a TCO layer 212 (transparent conductive oxide) is added which, for example, may be indium tin oxide (ITO), cadmium stannate ($Cd_2SnO_4$), or doped tin oxide ($SnO_2$). The TCO layer will be added following the post compensation of fluorine (and hydrogen) if the films were not deposited with one or more of the desired compensating or altering elements therein. Also, the other compensating or altering elements, above described, can be added by post compensation.

An electrode grid 214 can be added to the device 198 if desired. For a device having a sufficiently small area, the TCO layer 212 is generally sufficiently conductive such that the grid 214 is not necessary for good device efficiency. If the device is of a sufficiently large area or if the conductivity of the TCO layer 212 is insufficient, the grid 214 can be placed on the layer 212 to shorten the carrier path and increase the conduction efficiency of the device.

In this device as well as the p-n junction device of FIG. 7, the p+ layer (174 or 210) is utilized solely as a contact layer and should function optimally as a window to allow the sunlight to pass through for subsequent absorption in the depletion region of the device. To achieve such function, the layer should, of course, be thin (to avoid opacity) and should be characterized by a relatively large optical band gap.

Figure 11:
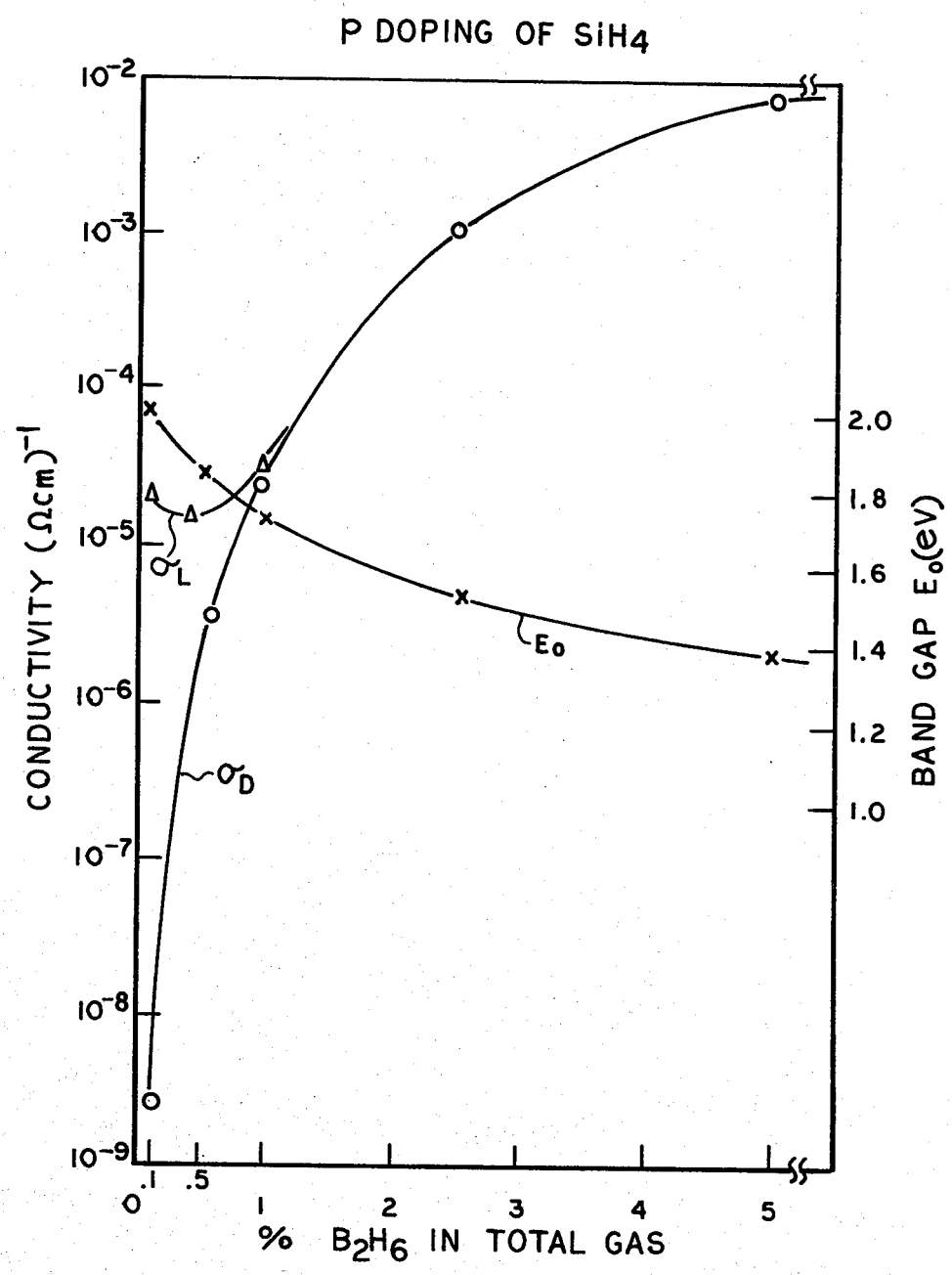
FIG. 11 is a graph illustrating the relationship of the optical band gap and conductivity of Si:H:B material as a function of percentage of $B_2H_6$ in a reaction gas mixture with $SiH_4$.

As mentioned earlier, the p-doping of a layer of silicon is commonly achieved by the introduction of a p-dopant such as boron into the Si:H alloy for example by the glow discharge decomposition of a reaction gas mixture of diborane ($B_2H_6$) and silane ($SiH_4$). FIG. 11 illustrates the effect of such boron doping, as described, upon amorphous silicon. As can be seen, the addition of $B_2H_6$ to the silane gas has considerable effect upon the conductivity and the band gap of the deposited Si:H combination, (deposited d.c. at a gas flow rate of about 10 standard cubic centimeters per minute) increasing the conductivity of the device and decreasing its optical band gap, $E_o$. Narrowed band gap material, when employed as a window layer of a device, will prevent a portion of incident photon energy from reaching the current-generating portion of the device and, in effect, will cause the p+ layer to act as an absorptive radiation "shield" rather than a "window."

The absorption of photon energy in the p+ contact layer of a photoresponsive device results in the generation of hole-electron pairs as does absorption within the depletion region of the device. However, the relatively high density of states of the p+ doped layer results in prompt recombination, essentially preventing the generated carriers from contributing to the device's current and, therefore, lessening device efficiency. Thus, photoreceptive devices of the prior art, similar to those of FIGS. 7 through 10, which have included a p+ layer interposed between incoming solar radiation and the device depletion layer or region, have been hampered in terms of efficiency by the unwanted absorption of photon energy (particularly in the blue or short wavelength portion of the spectrum) at the p+ window.

Figure 12:
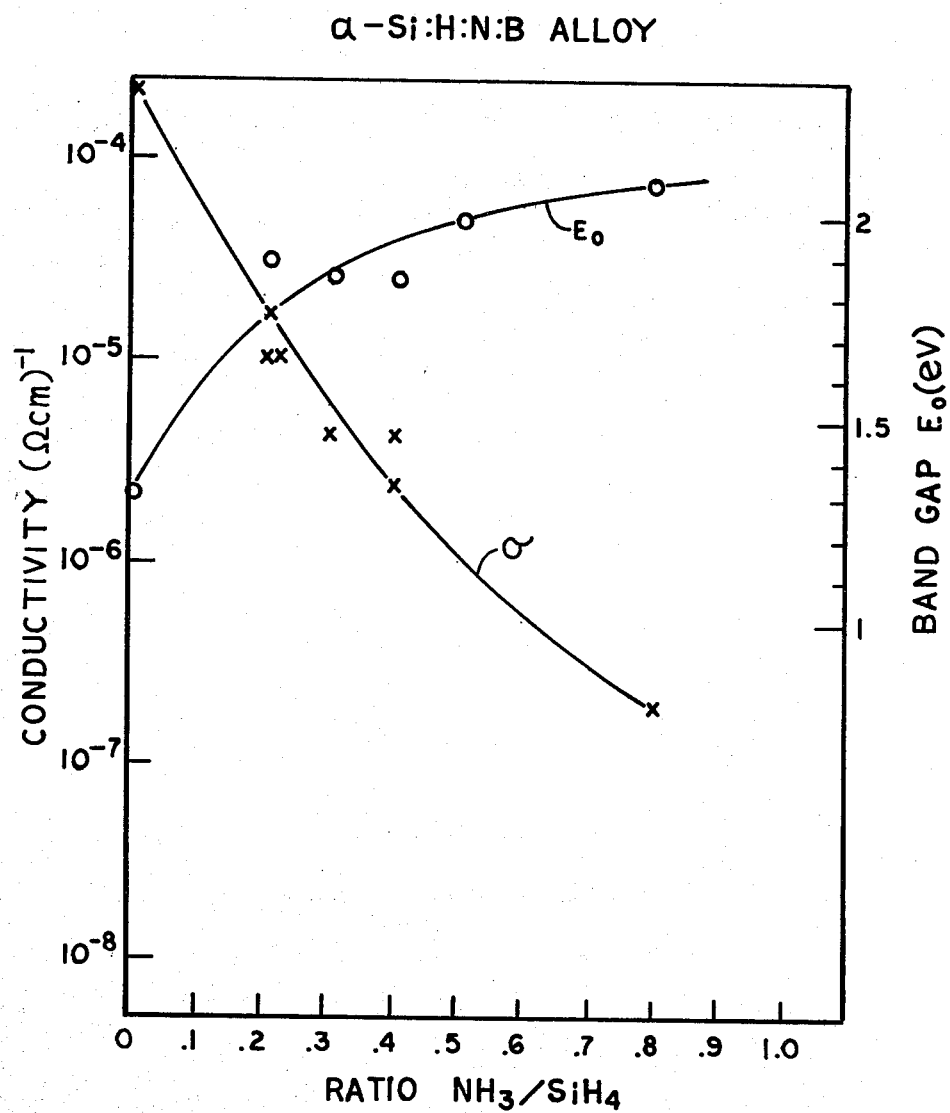
FIG. 12 is a graph illustrating the relationship of the optical band gap and conductivity of Si:H:N:B material as a function of the ratio of $NH_3$ to $SiH_4$ in the reaction gas mixture.

FIG. 12 is a graph illustrating the dependence of the conductivity and band gap of amorphous (p-type) silicon having a Si:H:N:B composition produced by the glow discharge deposition of a mixture of silane, diborane and ammonia ($NH_3$). The diborane ($B_2H_6$) was introduced at a concentration of between 8% and 12% in generating the data of FIG. 12, while the ratio of $NH_3$ to $SiH_4$, plotted on the abscissa of the graph, was varied. As can be seen from this graph, the incorporation of nitrogen in varying amounts (via the inclusion of $NH_3$ in a reaction gas mixture) results in a reversal of the effects due to the introduction of boron dopant shown in FIG. 11. The present graph shows that the band gap of the material (deposited at an r.f. power of 10 watts and a temperature of 350° C.) is rapidly widened to approximately 2.0 eV as the proportion of ammonia to silane in the reaction gas mixture reaches about 0.3.

Figure 13:
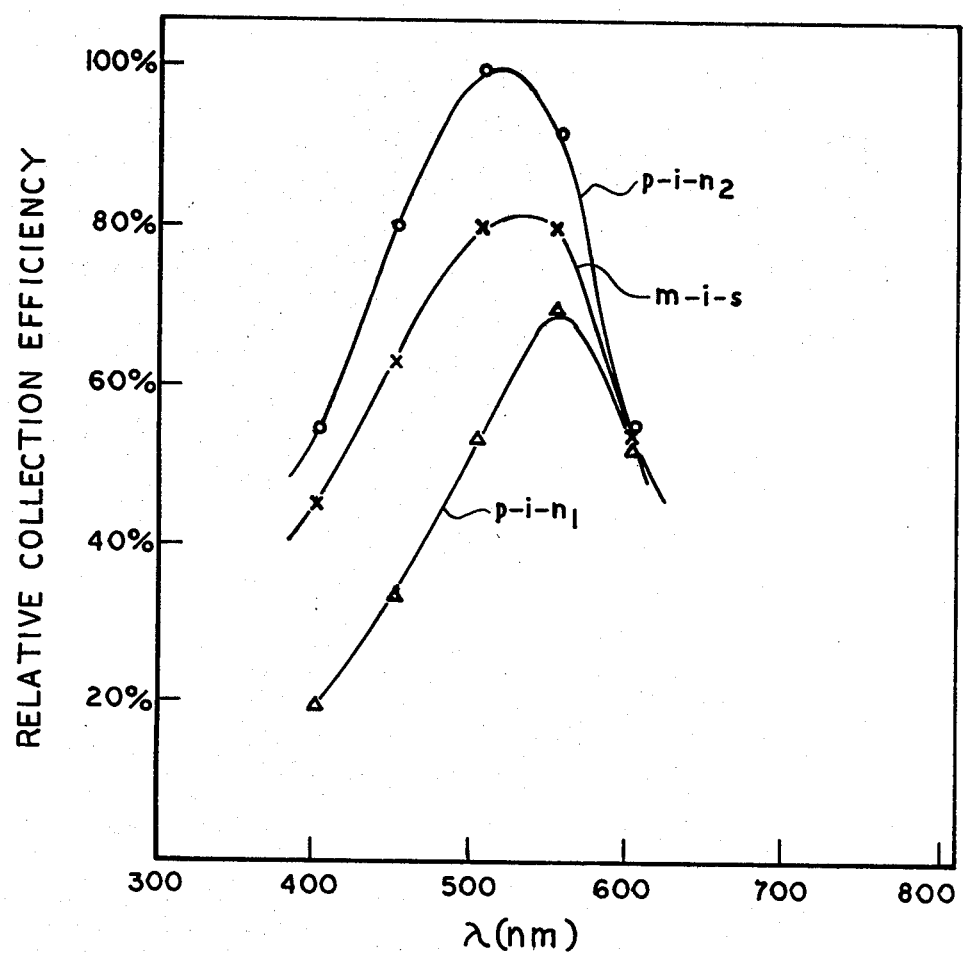
FIG. 13 is a graph illustrating the relative collection efficiencies of three photoresponsive devices as a function of wavelength of incident radiation.

FIG. 13 illustrates the performance of a p-i-n photovoltaic device corresponding in structure to that of FIG. 10. The device incorporates for its p+ window Si:H:N:B alloy prepared in accordance with the teaching of the previous figure. The overall device was formed upon a substrate of glass including a molybdenum layer on top as back contact. The top contact was formed of gold-palladium alloy.

The amosphous alloy sandwiched between the top and back contacts of the p-i-n device was formed by the glow discharge deposition of appropriate reaction gases at an r.f. power of 10 watts. A 500 angstrom thick layer of n-type amorphous material was first produced after a 60 second deposition from a reaction gas mixture of silane and 3% phosphine ($PH_3$) at about 300° C. The intrinsic layer of the amorphous alloy, approximately 0.5 microns thick, was formed in about nine minutes by glow discharge deposition from silane at about 350° C. and 10 watts r.f. power. Finally, a p+ window layer, having a thickness of 300 angstroms, was prepared according to the teachings of FIG. 12. The p+ layer was produced by the introduction of $NH_3$, $SiH_4$ and $B_2H_6$ (9 percent concentrated) gases at flow rates in the ratio 1:5:5, resulting in p-doped material exhibiting a conductivity of $10^{-5}$ $(\Omega \text{ cm})^{-1}$ and an optical band gap of 1.9 eV, desirable parameters for the proper functioning of a p-i-n device or, for that matter, for any of the devices of FIGS. 7-10. Auger analysis of the material disclosed a resulting Si:B:N composition of 54.3:23.2:22.5. (Auger analysis can not detect hydrogen).

The performance of the p-i-n device (p-i-n$_2$) prepared as aforesaid can be seen, in marked contrast to the performance of a structurally similar p-i-n device which, however, does not utilize the unique p-type material composition of the invention (p-i-n) and an m-i-s photodetector, in FIG. 13.

In FIG. 13, the relative collection efficiencies of the aforesaid devices are plotted as a function of the wavelength of the incident radiation. As is well known, the collection efficiency of a photodetector is limited (at long wavelengths) by a cutoff wavelength $\lambda$ (about 1000 nm for germanium and 700 nm for amorphous silicon) above which the well-known absorption coefficient, $\alpha$, is too small to give appreciable absorption. The short wavelength cutoff is due to the large amount of radiation observed near the surface of the device where recombination lifetime may be short. The relative collection efficiency of the p-i-n device formed as aforesaid is seen to exceed that of the m-i-s and the prior art p-i-n photodetector to a pronounced extent. This variance is particularly noticeable at the lower (blue) wavelengths. With regard to the standard p-i-n device, such an improvement in performance is predictable, as a large proportion of short wavelength, high energy photons are dissipated in the prior art device through surface or window absorption wherein quickly recombined electron-hole pairs of no use to overall device performance are generated. The improved collection efficiency of p-i-n with respect to the m-i-s device reveals that the incorporation of improved p-type material allows the p-i-n device to realize inherent structural advantages over the m-i-s.

The applicant has found that, while ammonia provides a reaction gas requiring relatively low activation energy, the invention is not limited in terms of method or resultant device thereby. Other nitrogen gases, including dry $N_2$, that are appropriate to the deposition process utilized (such as those capable of decomposing in a plasma in the case of a glow discharge process) and will not contaminate the resultant material may be utilized. The fact that nitrogen forms a stronger bond (by 30 percent) with silicon than the Si:Si bond, assures that the element will not be liberated during further processing of the device.

The inventor has additionally found that similar favorable results are obtained when material of $Si_xC_{l-x}$:H:B composition is employed for the p+ window. Such a layer may be produced by the plasma decomposition of a reaction gas mixture of silane, and methane ($CH_4$) with diborane as dopant. Solid carbon and other carbon compounds may also be incorporated in the production of the material. Such a doped layer having the foresaid composition has been found to have an energy gap larger than 1.9 eV so that the collection efficiency of a p-i-n or p-n junction photodetector such as disclosed herein will be greatly enhanced in a manner analogous to that shown in FIG. 13.

The alloy layers other than the intrinsic alloy layer can be other than amorphous layers, such as polycrystalline layers. (By the term "amorphous" is meant an alloy or material which has long range disorder, although it may have short or intermediate order or even contain at times some crystalline inclusions.)

Modifications and variations of the present invention are possible in light of the above teachings. It is therefore to be understood that within the scope of the appended claims the invention may be practiced otherwise than as specifically described.

What is claimed is:

1. A method for producing an amorphous layer of p-type semiconductor alloy having a wide band gap comprising the steps of:
   a. depositing a layer of silicon;
   b. incorporating a p-type dopant in said silicon;
   c. incorporating at least one density of states reducing element in said layer of silicon; and
   d. introducing nitrogen as a band gap increasing element into said layer.

2. A method as defined in claim 1 wherein said dopant is boron.

3. A method as defined in claim 1 wherein the density of states reducing element is hydrogen.

4. A method as defined in claim 1 wherein the density of states reducing element is fluorine.

5. A method as defined in claim 1 wherein said layer is formed by glow discharge deposition from a mixture of reaction gases including $SiH_4$, $B_2H_6$ and $NH_3$.

6. A method as defined in claim 1 wherein said layer is formed by glow discharge deposition from a mixture of reaction gases including $SiH_4$, $B_2H_6$ and $N_2$.

7. A method as defined in claim 1 including evaporating said increasing element prior to introducing it into said layer.

8. A method as defined in claim 7 including plasma activating said increasing element as it is being introduced into said layer.

9. A method as defined in claim 1 further comprising two density of states reducing elements.

10. A method as defined in claim 9 wherein said density of states reducing elements are fluorine and hydrogen.

11. A method of making an improved photoresponsive amorphous alloy, said method comprising the steps of:
   a. depositing on substrate a material including at least silicon;
   b. incorporating in said material at least one density of states reducing elements and at least one dopant; and
   c. introducing at least one band gap increasing element into said material without substantially increasing the states in the band gap to produce an alloy having a band gap with an increased utilization width.

12. The method as defined in claim 11 wherein said alloy is glow discharge deposited from at least a mixture of $SiH_4$ and $NH_3$.

13. The method as defined in claim 11 wherein said alloy is glow discharge deposited from at least a mixture of $SiH_4$ and $N_2$.

14. The method as defined in claim 11 wherein said alloy is deposited with an active photoresponsive region therein and said band gap increasing element is introduced at least in a portion of said region.

15. The method as defined in claim 11 wherein said method forms one step in a multi-step process for forming successively deposited alloy layers of opposite (p and n) conductivity type, the n-type layer being formed by introducing during the deposition of the layer an n-dopant element which is deposited with the deposited layer to produce an n-type layer and the p-type layer being formed by introducing during deposition of the layer a p-dopant element which is deposited with the deposited layer to produce a p-type layer and wherein said band gap increasing element is introduced within said p-type layer during the deposition thereof.

16. The method as defined in claim 15 wherein there is deposited between said p and n doped layers an intrinsic amorphous alloy layer without a p or n dopant element present therein, at least a portion of said intrinsic layer containing said band gap increasing element adjacent to said p doped layer containing said band gap increasing element.

17. The method as defined in claim 11 further including introducing a second density of states reducing element, said second element being hydrogen.

18. The method as defined in claim 17 wherein both said density of states reducing elements are incorporated into said depositing alloy substantially simultaneously with said band gap increasing element.

19. The method as defined in claim 11 wherein said reducing element is incorporated into said alloy after deposition thereof.

20. The method as defined in claim 11 wherein said increasing element is introduced into said alloy in varying amounts.

21. The method as defined in claim 11 including plasma activating said increasing element as it is being introduced into said alloy.

22. The method as defined in claim 11 wherein said method includes depositing at least a portion of said alloy with a p dopant element therein to form a p conductivity type alloy.

* * * * *